United States Patent
Cai et al.

(10) Patent No.: US 8,487,594 B2
(45) Date of Patent: Jul. 16, 2013

(54) ACCURATE CURRENT SENSING CIRCUIT WITH ULTRA LOW VOLTAGE SUPPLY

(75) Inventors: Zhenbiao Cai, Shenzhen (CN); Haibo Zhang, Shenzhen (CN)

(73) Assignee: STMicroelectronics (Shenzhen) R&D Co., Ltd., Shenzhen (CN)

( * ) Notice: Subject to any disclaimer, the term of this patent is extended or adjusted under 35 U.S.C. 154(b) by 465 days.

(21) Appl. No.: 12/902,009

(22) Filed: Oct. 11, 2010

(65) Prior Publication Data

US 2011/0089923 A1    Apr. 21, 2011

(30) Foreign Application Priority Data

Oct. 15, 2009   (CN) .......................... 2009 1 0179756

(51) Int. Cl.
   *G05F 1/613*   (2006.01)
   *G05F 1/40*    (2006.01)

(52) U.S. Cl.
   USPC .............................. 323/225; 323/284; 323/351

(58) Field of Classification Search
   USPC .................. 323/222, 225, 271, 282–290, 351
   See application file for complete search history.

(56) References Cited

U.S. PATENT DOCUMENTS

| | | | | |
|---|---|---|---|---|
| 7,126,318 B2 * | 10/2006 | Oswald et al. | ............... | 323/288 |
| 7,482,789 B2 * | 1/2009 | Motomori et al. | ............ | 323/224 |
| 7,495,423 B1 * | 2/2009 | Knight et al. | ................. | 323/284 |
| 8,294,434 B2 * | 10/2012 | Nishida | ......................... | 323/224 |
| 8,358,118 B2 * | 1/2013 | Chen et al. | .................... | 323/285 |

* cited by examiner

*Primary Examiner* — Jessica Han
(74) *Attorney, Agent, or Firm* — Slater & Matsil, L.L.P.

(57) ABSTRACT

An integrated circuit includes a DC-DC converter, which includes an inductor; a first transistor coupled to the inductor and configured to pass an inductor current to the inductor; and a second transistor forming a current mirror with the first transistor. The integrated circuit further includes an operational amplifier. The operational amplifier includes a first input node and a second input node. The first input node is configured to couple to a drain of the first transistor when the first transistor is turned on, and decoupled from the drain of the first transistor when the first transistor is turned off. The second input node is coupled to a drain of the second transistor.

24 Claims, 5 Drawing Sheets

ACCURATE CURRENT SENSING CIRCUIT WITH ULTRA LOW VOLTAGE SUPPLY

CROSS REFERENCE TO RELATED APPLICATION

This application claims the priority benefit of China Patent Application No. 200910179756.6, filed on Oct. 15, 2009, and entitled "Accurate Current Sensing Circuit With Ultra Low Voltage Supply," which is hereby incorporated by reference to the maximum extent allowable by law.

TECHNICAL FIELD

This invention relates generally to integrated circuits, and more particularly to DC-DC converters, and even more particularly to current sensing circuits for DC-DC converters.

BACKGROUND

DC-DC converters are commonly used in integrated circuits for providing stable voltages. There are many varieties of DC-DC converters. FIG. 1 illustrates a circuit diagram of a conventional on-chip current sensing circuit in a current programmed mode (CPM) DC-DC converter.

In the current sensing circuit shown in FIG. 1, current IL", which is also the charging current during the on state of the DC-DC converter, is sensed. Transistor M1", when turned on, may conduct inductor current IL" to inductor L" and capacitor CL". Inductor current IL" flows through sense resistor Rsense" to generate a voltage between the positive input and the negative input of operational amplifier OP. The output voltage at node OPout thus reflects the voltage on sense resistor Rsense", and reflects inductor current IL". The voltage at node OPout and a saw-tooth voltage is summed by a summation circuit (not shown) and fed to a control logic generator, which comprises comparator U1", flip-flop U2", and pre-driver U3". The control logic generator generates signals for controlling the operation of transistor M1".

It is realized that inductor current IL" has a relatively great amplitude. On the other hand, to maintain the accuracy and to reduce the process variation of sense resistor Rsense", sense resistor Rsense" cannot be too small. This means that a considerable amount of power is wasted by sense resistor Rsense", especially in high-load applications.

FIG. 2 illustrates the circuit diagram of another conventional current sensing circuit, which includes transistors M1' and M2' that may form a current mirror during the ON state of the respective DC-DC converter. With transistor M1' having a greater aspect ratio (a ratio of gate width to gate length) than transistor M2', the inductor current IL' that flows through transistor M1' is mirrored to a smaller current IM2' that flows through transistor M2'. The sense current flows through resistor Rsense' to generate a sense voltage at node C'. The value of sensing current Isense' equals to the difference between current IM2' and current I2 of a constant current source. Switches S1 and S2, comparator U1', flip-flop U2', and pre-driver U3' are used to control the operation of the control logic generator.

If the ratio of the aspect ratio of transistor M1' to the aspect ratio of transistor M2' is N, and the voltage at node A' exactly matches that of node B, the I2V ratio of inductor current to the sensing voltage at node C (during the on-state of the DC-DC converter) may be expressed as:

$$I2V = \frac{IL'}{(IL'/N - I2) \times Rsense'}$$ [Eq. 1]

$$= \frac{1}{Rsense'/N - I2 \times Rsense'/IL'} \approx N/Rsense'$$

It is observed that the element I2×Rsense'/IL' may be neglected if it is much smaller than Rsense'/N. However, it may adversely result in the non-linearity in the I2V ratio if inductor current IL' is small enough to cause I2×Rsense'/IL' to be comparable with Rsense'/IL.

Further, bipolar transistors Q1 and Q2 are used to maintain equal voltages at nodes A' and B', so that currents IL' and IM2' may be proportional to each other accurately. However, the voltage mirror that employs bipolar transistors Q1 and Q2 is not capable of forcing an accurate matching of the voltages. As a result, the accuracy of the current sensing circuit is seriously degraded.

A further drawback of the current sensing circuit in FIG. 2 is the demanding requirement to supply voltage VIN. The voltage at node A' needs to be great enough in order to turn on NMOS transistor M3' and PNP transistor Q2, so that inductor current IL' may be sensed as intended. Accordingly, voltage VA' at node A' needs to satisfy the requirement:

$$VA' \gtrsim VC' + V_{TH(M3')} + V_{EB(Q2)}$$ [Eq. 2]

Wherein voltage VC' is the voltage at node C', voltage $V_{TH(M3')}$ is the threshold voltage of transistor M3, and voltage $V_{EB(Q2)}$ is the emitter-to-base voltage of bipolar transistor Q2. Thus, if power supply voltage VCC of the DC-DC converter is less than 2V, the demanding requirement to voltage VA' at node A' cannot be satisfied, and the current sensing circuit cannot work correctly.

SUMMARY

In accordance with one embodiment, an integrated circuit includes a DC-DC converter, which includes an inductor; a first transistor coupled to the inductor and configured to pass an inductor current to the inductor; and a second transistor forming a current mirror with the first transistor. The integrated circuit further includes an operational amplifier. The operational amplifier includes a first input node and a second input node. The first input node is configured to couple to a drain of the first transistor when the first transistor is turned on, and decoupled from the drain of the first transistor when the first transistor is turned off. The second input node is coupled to a drain of the second transistor.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The specific embodiments discussed are merely illustrative of specific ways to make and use the invention, and do not limit the scope of the invention.

Figure 1:
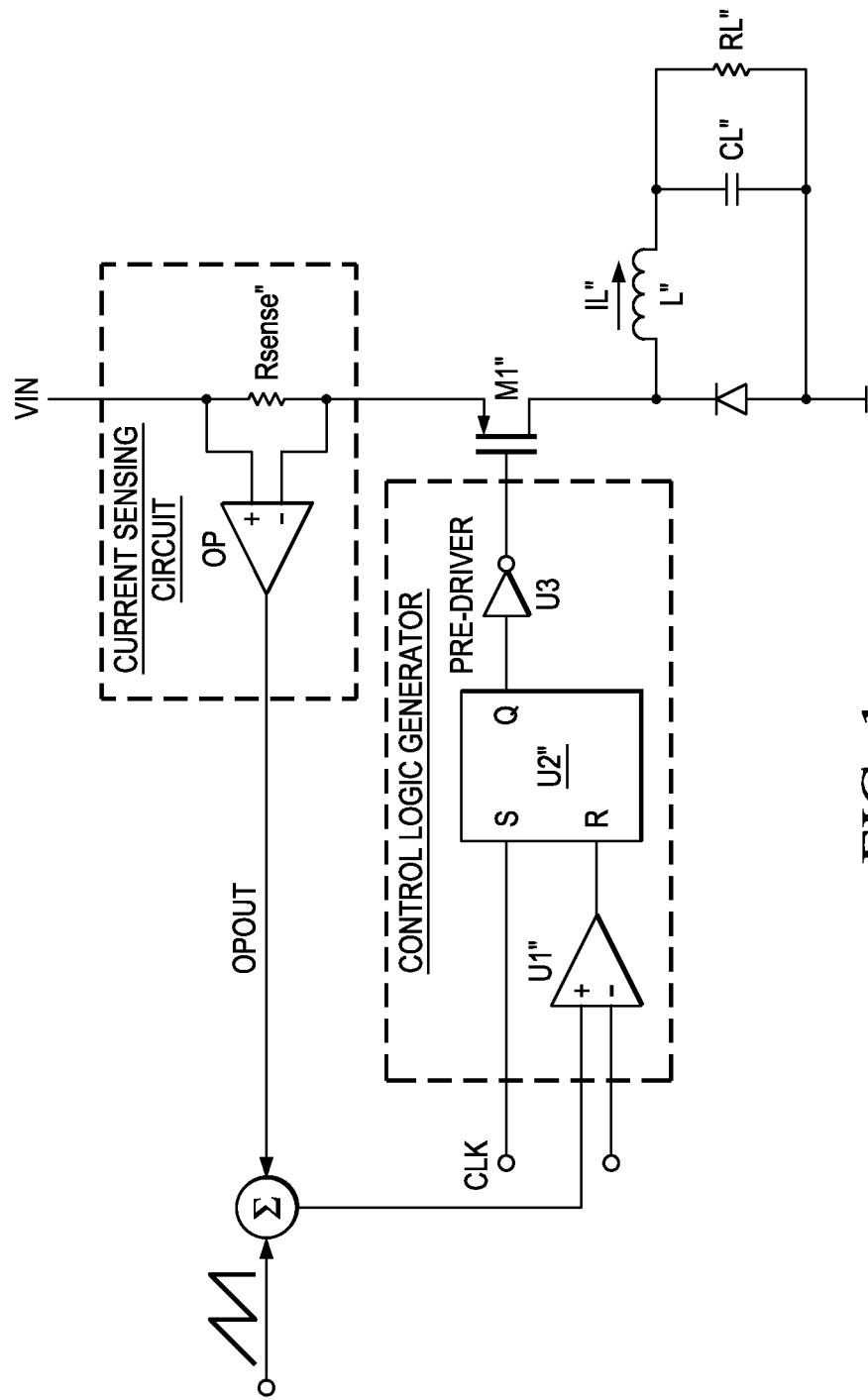
FIGS. 1 and 2 are circuit diagrams of conventional current sensing circuits.
Figure 2:
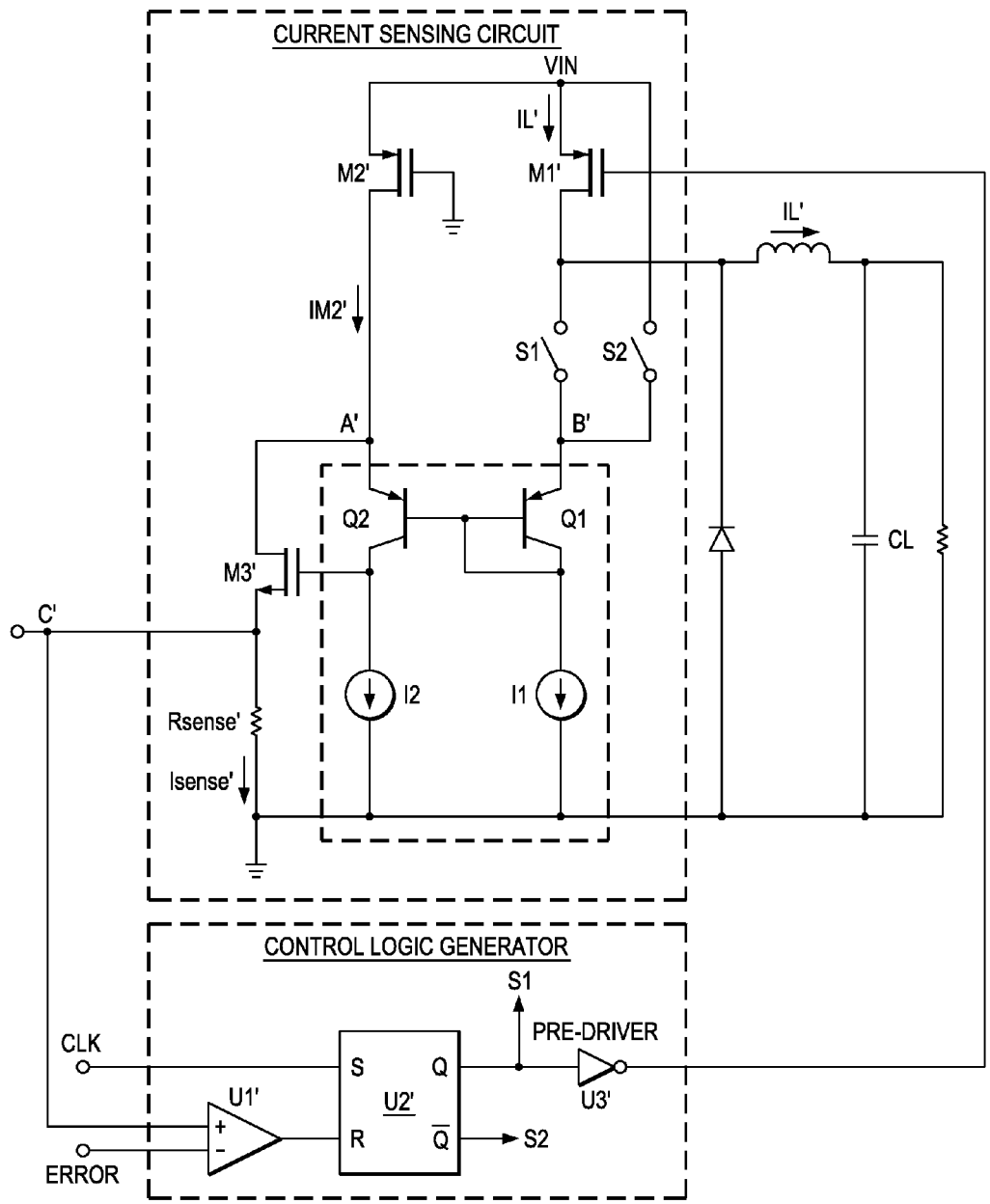
Figure 3:
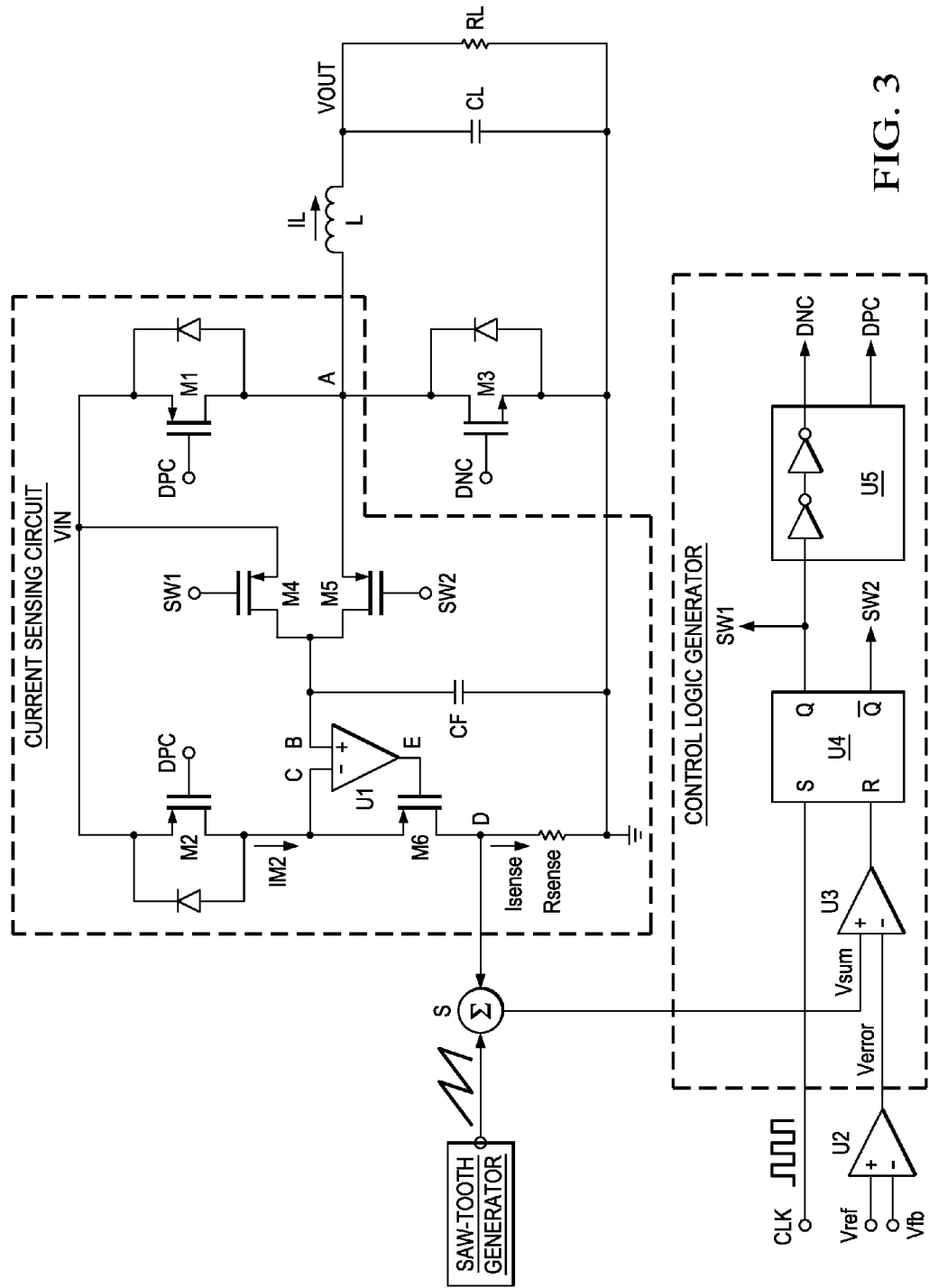
FIG. 3 is a circuit diagram of a current sensing circuit in accordance with one embodiment, wherein a high-side of a DC-DC converter is sensed.

FIG. 3 illustrates a buck current programmed mode (CPM) DC-DC converter comprising a current sensing circuit in accordance with an embodiment. Resistor RL is a load resistor. Capacitor CL and inductor L function to store the power charged from power node VIN, wherein capacitor CL may also be a load capacitor. Transistor M1 is the high-side of the DC-DC converter and is used for charging capacitor CL and inductor L. Transistor M3 is the low-side of the DC-DC converter, and may be used for discharging. P-type transistors M1 and M2 may form a current mirror. In an embodiment, the gates of transistors M1 and M2 are coupled to node DPC of the control logic generator. In alternative embodiments, the gate of transistor M2 is grounded, and hence transistor M2 is always turned on, while the gate of transistor M1 is coupled to node DPC. Transistors M1, M2, and M3 may be double diffusion power transistors formed using, for example, bipolar-CMOS-DMOS (BCD) process. Accordingly transistors M1 and M2 are p-type double diffusion MOS (PDMOS) transistors, while transistor M3 is an n-type double diffusion MOS (NDMOS) transistor. The gate of transistor M3 may be coupled to the output node DNC of the control logic circuit.

The function of the control logic circuit is briefly discussed as follows. The control logic circuit includes error amplifier U2, comparator U3, flip-flop U4, and pre-driver U5. Error amplifier U2 generates an error voltage Verror by comparing a reference voltage Vref and a feedback voltage Vfb which is a partial voltage proportional to output voltage VOUT of the DC-DC converter. The sensing voltage VD at node D may be (or may not be) summed with a saw-tooth voltage by summation circuit S to generate voltage Vsum. Comparator U3 compares voltage Vsum with error voltage Verror, and the output from comparator U3 is used by flip-flop U4 to generate switch signals at nodes SW1 and SW2, which are connected to the gates of PMOS transistors M4 and M5, respectively. Pre-drive U5 receives the switch signal from node SW1 and generates voltages on nodes DPC and DNC, which voltages are used to control and drive transistors M1, M2, and M3.

PMOS transistors M4 and M5 are used as switches to control the current sensing circuit, so that the current sensing circuit senses inductor current IL only during an ON state (the state wherein transistor M1 is turned on) of the respective DC-DC converter. During the Off state of the DC-DC converter, no current sensing is performed.

During the ON state of the DC-DC converter, transistor M4 is turned off (with the voltage at node SW1 being high if transistor M4 is a PMOS transistor), while transistor M5 is turned on (with the voltage at node SW2 being low if transistor M5 is a PMOS transistor). Nodes A and B are interconnected, and have substantially the same voltage. In an embodiment, operational amplifier U1 has CMOS-base inputs (input nodes, marked as "+" and "−"), which means the gates of CMOS transistors are used to receive input signals. Accordingly, the input currents at nodes B and C are very low, for example, at a nano-ampere level, and hence the voltage difference between nodes A and B is negligible. In alternative embodiments, operational amplifier U1 has bipolar-base inputs, which means the bases of bipolar transistors are used to receive input signals. Accordingly, the input currents at nodes B and C are relatively high, for example, at several hundred nano-amperes level. This results in the current offset on the sensing side. The effects of the current offset are discussed in detail herein.

During the ON state of the DC-DC converter, transistor M1 is turned on, so that inductor current IL flows through transistor M1 to charge inductor L and capacitor CL, and hence output voltage VOUT increases. In the meantime, transistor M2 is also turned on, and inductor current IL is sensed through the current mirror formed of transistors M1 and M2. Assuming the aspect ratio (the gate width to gate length ratio) of transistor M2 is $W/L_{M2}$, and the aspect ratio of transistor M1 is $W/L_{M1}$, a ratio of aspect ratio $W/L_{M1}$ to aspect ratio $W/L_{M2}$ may be expressed as N:1, with N being greater than 1. In an example embodiment, value N may be between about 300 and about 500, although value N may also be greater or smaller. Since inductor current IL and current IM2 through transistor M2 are mirrored, current IM2 is IL/N. It is observed that the inputs B and C of operational amplifier U1 are virtually connected. Accordingly, voltage VC at node C is equal to voltage VB at node B. As a result, voltage VC is also equal to voltage VA at node A. Operational amplifier U1 thus enforces the matching of voltages at nodes A and C in order to make the drain voltages of transistors M1 and M2 the same. Thus, it improves the accuracy of the current sensing and the linearity of the current sensing circuit effectively, and the ratio of inductor current IL to current IM2 matches the ratio $(W/L_{M1})/(W/L_{M2})$.

Operational amplifier U1 and PMOS transistor M6 further form a negative feedback loop to improve the matching of voltages VB and VC. For example, if voltage VOUT (which is the output voltage of the DC-DC converter) increases, voltage VE (which is the output voltage of operational amplifier U1) at node E increases, and hence PMOS transistor M6 becomes less conductive. As a result, the source current IM2 of PMOS transistor M6 decreases. Voltage VC, which equals voltage VIN minus the product of current IM2 and the resistance of transistor M2, increases accordingly. Therefore, the negative feedback loop forces voltage VC to match voltage VA precisely.

When the DC-DC converter enters an OFF state, the signal at node SW1 is low and the signal at node DPC and SW2 are high. Accordingly, transistor M4 is turned on to pull up the voltage VB at node B, hence the voltage VC at node C is also pulled up. This substantially eliminates the current flowing through transistor M2 (by equalizing the source voltage and drain voltage of transistor M2), and hence prevents a high current to be generated on the sensing side (the side with transistors M6 and sense resistor Rsense). Capacitor CF is used to filter the voltage jitter of voltage VB at node B during the state transitions of the DC-DC inverter. During the OFF state of the DC-DC converter, since the signal at node DPC is high, and the signal at node DNC is high, no charging is performed, and transistor M3 may be used for discharging, if needed. Further, with the signal at node SW2 being high, node A is disconnected from node B.

In the circuit shown in FIG. 3, sensing voltage VD is outputted at node VD, and is equal to current Isense through sense resistor Rsense times resistance Rsense. Due to the nano-ampere level of the CMOS operational amplifier's (U1) negative input current, current IM2 is substantially equal to current Isense. The ratio 12V of inductor current IL to the sensing voltage output VD (during the ON state of the DC-DC converter) thus may be expressed as:

$$I2V = \frac{IL}{(IL/N) \times Rsense} = N/Rsense \quad \text{[Eq. 3]}$$

As indicated by Equation 3, the linearity of the current sensing circuit may remain even if inductor current IL is very small, and hence the linear sensing range of the current sensing circuit shown in FIG. 3 is expanded over that of conventional current sensing circuits.

To ensure that the current sensing circuit to function properly, voltage VC needs to be great enough in order to turn on PMOS transistor M6. The minimum value VC_MIN of voltage VC may be expressed as:

$$VC\_MIN \geq V(CM\_OPOUT)\_MIN + |VTH(M6)| \quad \text{[Eq. 4]}$$

wherein voltage V(CM_OPOUT)_MIN is the minimum common-mode output voltage (at node E) within the linear region of operational amplifier U1, and is typically between about 0.1V and about 0.2V. Voltage VTH(M6) is the threshold voltage of transistor M6. The minimum value VC_MIN is thus only about 1V or less. Therefore, the current sensing circuit as shown in FIG. 3 can work properly under ultra-low power voltage VIN between about 1.2V and about 1.5V.

In an embodiment, as discussed in preceding paragraphs, operational amplifier U1 may adopt bipolar-based inputs. Due to the relatively high input currents at the bipolar-base inputs, which may be several hundred nano-amperes, there will be a voltage drop between node A and node B during the ON state of the DC-DC converter. This results in a current offset inserted to the sensing side (which offset current is added to current IM2). The current offset insertion is effective in avoiding system instability when the DC-DC converter is operated under a light load and at PWM mode.

Figure 4:
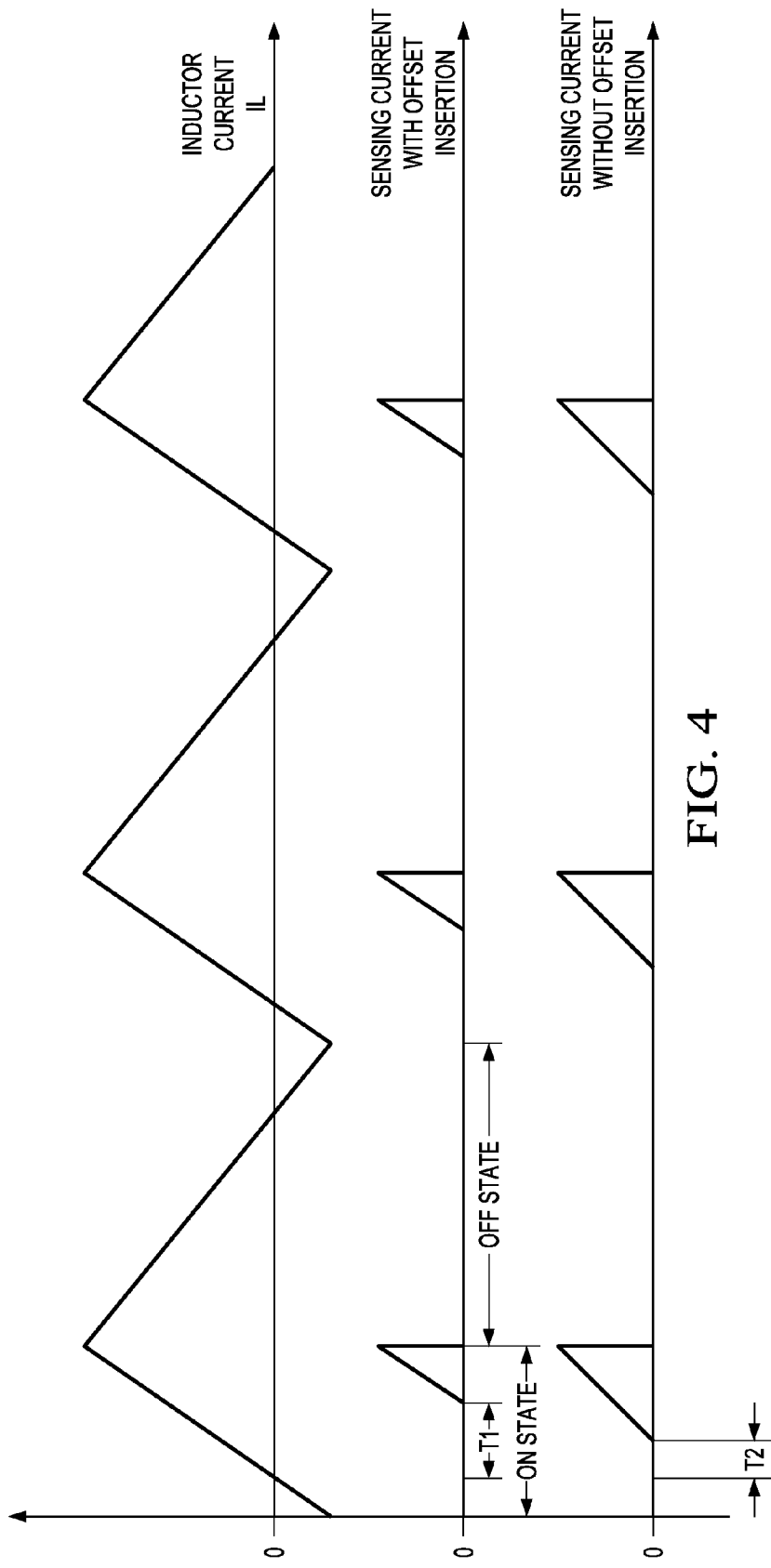
FIG. 4 illustrates waveforms generated from the embodiments.

FIG. 4 shows the effect of the current offset insertion. The first waveform in FIG. 4 is the waveform of inductor current IL. The second and the third waveforms are the waveforms of current IM2 or sensing current Isense, with the second waveform obtained from a current sensing circuit with operational amplifier U1 having CMOS-based inputs, and the third waveform obtained from a current sensing circuit with operational amplifier U1 having bipolar-based inputs. The second waveform indicates that, when inductor current IL recovers from a negative value, there will be sensing delay T1 due to the finite speed of operational amplifier U1. It's possible that the current sensing circuit cannot sense the inductor current IL in time if the positive inductor current is small and the respective duty cycle is short. If the current sensing circuit fails to sense inductor current IL during some periods, the DC-DC converter may become unstable. However, referring to the third waveform, with the current offset inserted, the sensing delay T1 is reduced to T2, and hence the likelihood of failure to sense is reduced.

Figure 5:
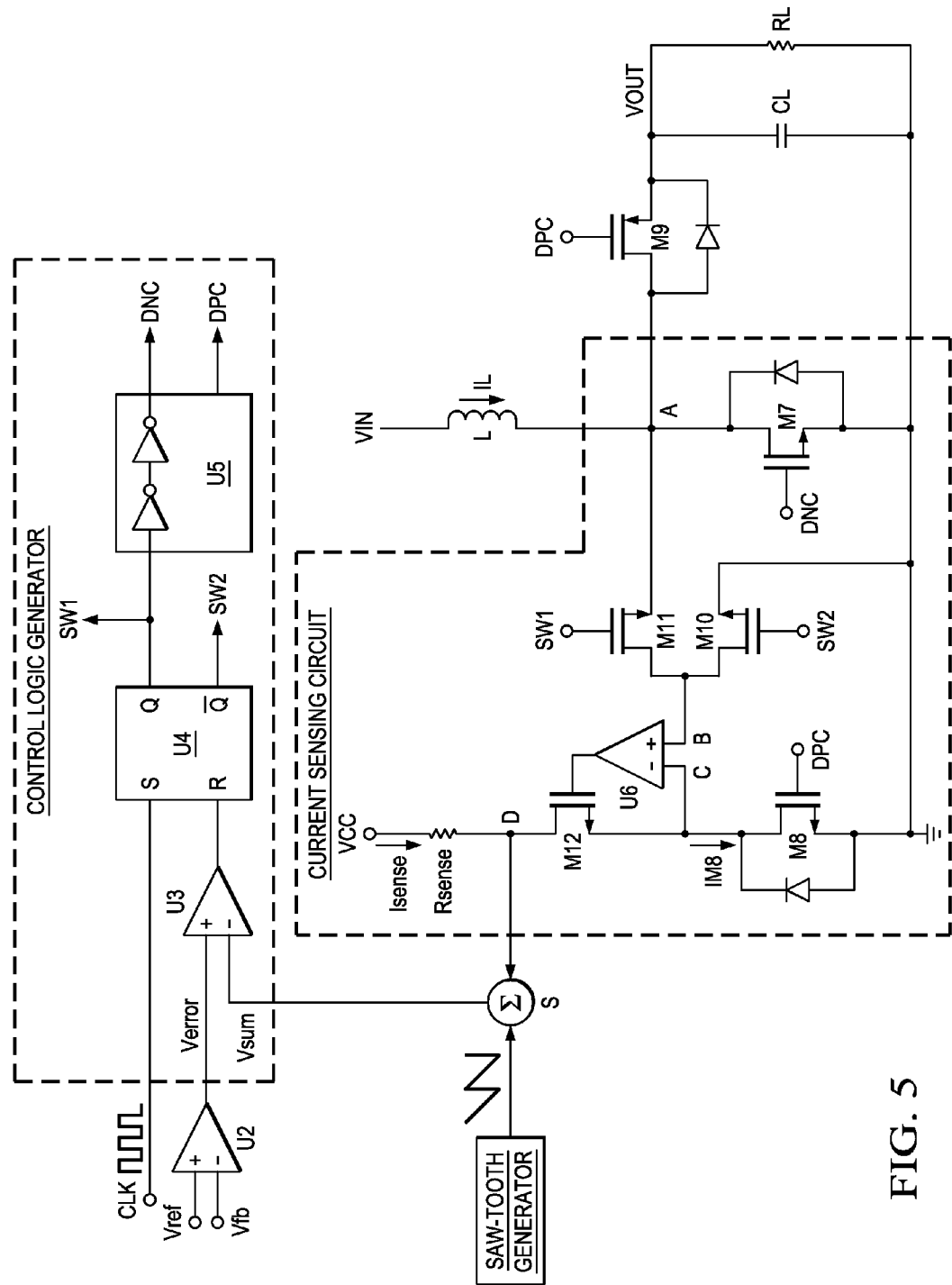
FIG. 5 is a circuit diagram of a current sensing circuit in accordance with another embodiment, wherein a low-side of a DC-DC converter is sensed.

FIG. 5 illustrates a CPM DC-DC converter comprising a current sensing circuit in accordance with an alternative embodiment, wherein the alternative current sensing circuit is a dual of the current sensing circuit shown in FIG. 3. Unless specified otherwise, the devices in the circuit shown in FIG. 5 may have similar functions and similar specifications as the devices shown with like reference notations as shown in FIG. 3. Instead of sensing the high-side, the current sensing circuit in FIG. 5 senses the low-side of a DC-DC converter. Transistors M7, M8, and M10-M12 are NMOS transistors. Transistors M7 and M8 may be power transistors formed using BCD processes, and may be NDMOS transistors. Transistor M9 may be a PDMOS transistor. In an embodiment, aspect ratio $W/L_{M7}$ of transistor M7 to aspect ratio $W/L_{M8}$ of transistor M8 may be N:1, with N being greater than 1. Again, sensing current IM8 (and current Isense) is 1/N of inductor current IL, and the accuracy of the current ratio between current IM8 and inductor current IL may be enforced by the use of operational amplifier U6, and the negative feedback loop formed of operational amplifier U6 and NMOS transistor M12. Transistors M10 and M11 are controlled by the signals generated by the control logic generator to enable and disable the current sensing circuit. The operation of the circuit shown in FIG. 5 may be appreciated by applying the teaching provided in preceding paragraphs. The details are thus not discussed herein.

The embodiments have several advantageous features. With the use of the operational amplifier and the negative feedback loop, the sensing accuracy is improved over conventional current sensing circuits adopting bipolar transistors. The linearity of the sensing ratio may be maintained within a great range of inductor current. The current sensing circuit may be used in ultra-low voltage applications. Additional advantageous features of the embodiments include the possibility of reducing sensing failure by inserting a current offset, fast transient response, and easy implementation.

Although example embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
   a DC-DC converter comprising:
      an inductor;
      a first transistor coupled to the inductor and configured to pass an inductor current to the inductor;
      a second transistor forming a current mirror with the first transistor; and
      an operational amplifier comprising:
         a first input node configured to be coupled to a drain of the first transistor when the first transistor is turned on, and decoupled from the drain of the first transistor when the first transistor is turned off; and
         a second input node coupled to a drain of the second transistor.

2. The integrated circuit of claim 1, wherein the first input node is coupled to the drain of the first transistor through a MOS transistor, and wherein the second input node is directly connected to the drain of the second transistor.

3. The integrated circuit of claim 1, wherein the integrated circuit further comprises:
   a third transistor comprising:
      a gate connected to an output of the operational amplifier;
      a source connected to the second input node of the operational amplifier; and a drain; and
a sense resistor coupled to the drain of the third transistor and in series with the second transistor and the third transistor.

4. The integrated circuit of claim 3 further comprising a summation circuit coupled to the drain of the third transistor.

5. The integrated circuit of claim 1, wherein the first transistor and the second transistor are p-type double diffusion MOS transistors.

6. The integrated circuit of claim 1, wherein the first transistor and the second transistor are n-type double diffusion MOS transistors.

7. The integrated circuit of claim 1, wherein the operational amplifier comprises a CMOS-based input.

8. The integrated circuit of claim 1, wherein the operational amplifier comprises a bipolar-based input.

9. The integrated circuit of claim 1 further comprising:
a capacitor coupled between an electrical ground and the first input of the operational amplifier; and
a switch coupled between a source of the first transistor and the first input of the operational amplifier, wherein the switch is configured to connect the source of the first transistor to the first input of the operational amplifier when the first transistor is turned off, and disconnect the source of the first transistor from the first input of the operational amplifier when the first transistor is turned on.

10. The integrated circuit of claim 1, wherein the first transistor has an aspect ratio greater than an aspect ratio of the second transistor.

11. An integrated circuit comprising:
an inductor;
a first power transistor coupled to the inductor;
a second power transistor comprising a source connected to a source of the first power transistor, wherein the first power transistor and the second power transistor are configured to form a current mirror;
an operational amplifier comprising:
a first input node coupled to a drain of the first power transistor; and
a second input node coupled to a drain of the second power transistor;
a first switch configured to connect the drain of the first power transistor to the first input when the first power transistor is turned on, and to disconnect the drain of the first power transistor from the first input node when the first power transistor is turned off; and
a second switch configured to connect the source of the first power transistor to the first input node when the first power transistor is turned off, and to disconnect the source of the first power transistor from the first input node when the first power transistor is turned on.

12. The integrated circuit of claim 11, wherein the first input node is a positive input node, and the second input node is a negative input node.

13. The integrated circuit of claim 11 further comprising a third power transistor coupled between the drain of the first power transistor and an electrical ground, wherein the third power transistor is configured to be turned off when the first power transistor is turned on.

14. The integrated circuit of claim 11 further comprising a third different transistor comprising:
a gate connected to an output of the operational amplifier; and
a source connected to the second input node of the operational amplifier.

15. The integrated circuit of claim 14 further comprising:
a sense resistor coupled in series with a source-drain path of the third different transistor;
a saw-tooth generator; and
a summation circuit comprising:
a first input node connected to the drain of the third different transistor; and
a second input node coupled to the saw-tooth generator.

16. The integrated circuit of claim 11 further comprising a capacitor comprising a first end coupled to the first input node of the operational amplifier, and a second end coupled to an electrical ground.

17. The integrated circuit of claim 11, wherein the operational amplifier comprises a CMOS-based input.

18. The integrated circuit of claim 11, wherein the operational amplifier comprises a bipolar-based input.

19. The integrated circuit of claim 11, wherein the first power transistor has an aspect ratio greater than an aspect ratio of the second power transistor.

20. An integrated circuit comprising:
an inductor;
a first p-type double diffused MOS (PDMOS) transistor coupled to the inductor;
a second PDMOS transistor comprising a source configured to have a same voltage as a source of the first PDMOS transistor, wherein the first PDMOS transistor and the second PDMOS transistor form a current mirror, and wherein the first PDMOS has an aspect ratio greater than an aspect ratio of the second PDMOS transistor;
an operational amplifier comprising:
a positive input; and
a negative input coupled to a drain of the second PDMOS transistor;
a switch configured to connect the drain of the first PDMOS transistor to the positive input when the first PDMOS transistor is turned on, and to disconnect the drain of the first PDMOS transistor from the first input node when the first PDMOS transistor is turned off; and
a PMOS transistor comprising:
a gate connected to an output of the operational amplifier; and
a source connected to the negative input of the operational amplifier; and
a sense resistor comprising a first end coupled to a drain of the PMOS transistor, and a second end coupled to an electrical ground.

21. The integrated circuit of claim 20 further comprising an n-type double diffusion MOS (NDMOS) transistor coupled between the drain of the first PDMOS transistor and the electrical ground, wherein the NDMOS transistor is configured to be turned off when the first PDMOS transistor is turned on.

22. The integrated circuit of claim 20 further comprising:
a saw-tooth generator; and
a summation circuit comprising:
a first input node connected to the first end of the sense resistor; and
a second input node coupled to an output of the saw-tooth generator.

23. The integrated circuit of claim 20, wherein the operational amplifier comprises CMOS-based inputs.

24. The integrated circuit of claim 20, wherein the operational amplifier comprises bipolar-based inputs.

* * * * *